United States Patent
Peng et al.

(10) Patent No.: US 11,942,908 B2
(45) Date of Patent: *Mar. 26, 2024

(54) ARCHITECTURE OF RADIO FREQUENCY FRONT-END

(71) Applicant: SMARTER MICROELECTRONICS (GUANG ZHOU) CO., LTD., Guangzhou (CN)

(72) Inventors: Yangyang Peng, Guangzhou (CN); Zeyan Chen, Guangzhou (CN)

(73) Assignee: SMARTER MICROELECTRONICS (GUANG ZHOU) CO., LTD., Guangzhou (CN)

( * ) Notice: Subject to any disclaimer, the term of this patent is extended or adjusted under 35 U.S.C. 154(b) by 546 days.

This patent is subject to a terminal disclaimer.

(21) Appl. No.: 17/134,250

(22) Filed: Dec. 25, 2020

(65) Prior Publication Data

US 2021/0119591 A1  Apr. 22, 2021

Related U.S. Application Data

(63) Continuation of application No. PCT/CN2019/127406, filed on Dec. 23, 2019.

(30) Foreign Application Priority Data

Sep. 23, 2019 (CN) .......................... 201910899230.9

(51) Int. Cl.
| | | |
|---|---|---|
| H03F 3/191 | (2006.01) | |
| H03F 1/56 | (2006.01) | |
| H03F 3/24 | (2006.01) | |

(52) U.S. Cl.
CPC ............. *H03F 3/245* (2013.01); *H03F 1/565* (2013.01); *H03F 2200/168* (2013.01); *H03F 2200/318* (2013.01); *H03F 2200/451* (2013.01)

(58) Field of Classification Search
CPC ....................................... H03F 3/191
USPC ................................. 330/305, 302
See application file for complete search history.

(56) References Cited

U.S. PATENT DOCUMENTS

| | | | | |
|---|---|---|---|---|
| 6,091,966 | A * | 7/2000 | Meadows | H03F 3/72 455/553.1 |
| 7,630,693 | B2 * | 12/2009 | Liu | H03F 1/02 455/127.1 |
| 9,602,063 | B2 * | 3/2017 | Kaatz | H03F 3/193 |
| 10,200,077 | B2 * | 2/2019 | Liu | H04B 1/0458 |
| 10,615,841 | B2 * | 4/2020 | Liu | H04B 1/48 |
| 2010/0157860 | A1 * | 6/2010 | Hagiwara | H04B 1/48 370/310 |
| 2016/0134414 | A1 * | 5/2016 | Pehlke | H04B 1/0057 370/280 |
| 2022/0103136 | A1 * | 3/2022 | Domino | H03F 3/195 |
| 2022/0103139 | A1 * | 3/2022 | Domino | H03F 1/56 |

* cited by examiner

*Primary Examiner* — Henry Choe
(74) *Attorney, Agent, or Firm* — Syncoda LLC; Feng Ma (57) ABSTRACT

An architecture of radio frequency front-end includes a power amplifier module integrated duplexer (PAMiD), an antenna and at least one tunable matching network; herein, the PAMiD includes a power amplifier, and the at least one tunable matching network is located between the power amplifier and the antenna, and is configured to adjust the impedance of the output end of the power amplifier and/or the impedance of the input end of the antenna.

19 Claims, 7 Drawing Sheets

ARCHITECTURE OF RADIO FREQUENCY FRONT-END

CROSS-REFERENCE TO RELATED APPLICATIONS

This application is a continuation of International Application No. PCT/CN2019/127406 filed on Dec. 23, 2019, which claims priority to Chinese patent application No. 201910899230.9 filed on Sep. 23, 2019. The disclosures of these applications are hereby incorporated by reference in their entirety.

BACKGROUND

An architecture of radio frequency front-end includes devices such as Power Amplifier (PA), Low Noise Amplifier (LNA), filter, duplexer, switch, antenna etc. With the increase of new frequency bands and the wide application of technologies such as carrier aggregation, Multiple Input Multiple Output (MIMO) etc. There are more and more radio frequency devices, and the architecture of radio frequency front-end also becomes more and more complicated. Various radio frequency devices can occupy a large area in the radio frequency system.

SUMMARY

The present disclosure relates generally to the field of electronics, for example, and more specifically to an architecture of radio frequency front-end.

The embodiments of the disclosure provide an architecture of radio frequency front-end.

The architecture of radio frequency front-end provided by the embodiments of the disclosure includes a power amplifier module integrated duplexer (PAMiD), an antenna and at least one tunable matching network;

Herein the PAMiD includes a power amplifier, and the at least one tunable matching network is located between the power amplifier and the antenna, and is configured to adjust the impedance of the output end of the power amplifier and/or the impedance of the input end of the antenna.

In an alternative implementation of the disclosure, the PAMiD further includes a first switch, a second switch and multiple branches located between the first switch and the second switch;

Herein each of the multiple branches includes a filter or a duplexer, and the input end and the output end of the filter or the duplexer are provided with an input matching network and an output matching network, respectively.

In an alternative implementation of the disclosure, the at least one tunable matching network includes at least one of: at least one first tunable matching network, at least one second tunable matching network, or at least one third tunable matching network.

In an alternative implementation of the disclosure, the first tunable matching network is located between the power amplifier and the first switch.

In an alternative implementation of the disclosure, a power amplifier matching network is further provided between the power amplifier and the first switch, and the power amplifier matching network is integrated into the PAMiD;

Herein the first tunable matching network is located between the power amplifier matching network and the first switch.

In an alternative implementation of the disclosure, the first tunable matching network is integrated into the PAMiD; or, The first tunable matching network is independently provided outside of the PAMiD.

In an alternative implementation of the disclosure, the second tunable matching network is located between the second switch and the antenna.

In an alternative implementation of the disclosure, an antenna matching network is further provided between the second switch and the antenna;

Herein the second tunable matching network is located between the antenna matching network and the antenna; or, The second tunable matching network is located between the second switch and the antenna matching network.

In an alternative implementation of the disclosure, in a case that the second tunable matching network is located between the second switch and the antenna matching network, the second tunable matching network is integrated into the PAMiD; or, the second tunable matching network is independently provided between the PAMiD and the antenna matching network.

In an alternative implementation of the disclosure, the third tunable matching network is located in the branch of the PAMiD.

In an alternative implementation of the disclosure, the third tunable matching network is an input matching network in the branch; or, The third tunable matching network is an output matching network in the branch.

In an alternative implementation of the disclosure, the tunable matching network includes at least one type of the following components: an inductor, a capacitor, a resistor, a transmission line or a switch; herein, the impedance value in the tunable matching network is adjustable.

In some embodiments of the disclosure, the architecture of radio frequency front-end includes a power amplifier module integrated duplexer (PAMiD), an antenna and at least one tunable matching network; herein, the PAMiD includes a power amplifier, and the at least one tunable matching network is located between the power amplifier and the antenna, and is configured to adjust the impedance of the output end of the power amplifier and/or the impedance of the input end of the antenna. By the impedance matching of the architecture of radio frequency front-end through the tunable matching network, the architecture of radio frequency front-end can maintain better operating performance in multiple radio frequency channels, which can overcome the difficulties in debugging and low flexibility of the radio frequency architecture in related art, and make the radio frequency architecture have characteristics such as high degree of integration, high performance, flexibility, low cost etc. at the same time.

DETAILED DESCRIPTION

At present, a widely used technical solution is to integrate the PA, LNA, filter, duplexer and switch into a single chip to form a Power Amplifier Module integrated Duplexer (PAMiD), and the PAMiD together with an antenna form a complete architecture of radio frequency front-end. With this technical solution, the area occupied by each radio frequency device can be reduced, however, such integration reduces the debugging freedom of each device, which brings great inconvenience to the radio frequency engineers' debugging in practical applications, and results in that each radio frequency device and module cannot achieve its own superior performance. At present, a widely used technical solution is to integrate the PA, LNA, filter, duplexer and switch into a single chip to form a Power Amplifier Module integrated Duplexer (PAMiD), and the PAMiD together with an antenna form a complete architecture of radio frequency front-end. With this technical solution, the area occupied by each radio frequency device can be reduced, however, such integration reduces the debugging freedom of each device, which brings great inconvenience to the radio frequency engineers' debugging in practical applications, and results in that each radio frequency device and module cannot achieve its own superior performance.

Figure 1:
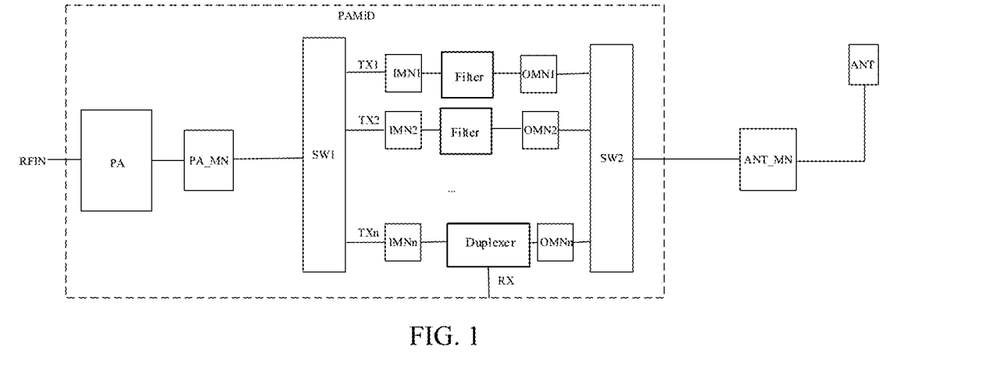
FIG. 1 is a first schematic diagram of an architecture of radio frequency front-end provided by some embodiments of the disclosure.

In an implementation, an architecture of radio frequency front-end is illustrated in FIG. 1, and FIG. 1 illustrates an architecture of radio frequency front-end of Multi-Mode Multi-Band (MMMB), herein, the architecture of radio frequency front-end includes a PAMiD, an Antenna Matching Network (ANT_MN) and an Antenna (ANT), herein, the PAMiD includes a PA, a Power Amplifier Matching Network (PA_MN), a first switch (SW1) and a second switch (SW2), and multiple branches TX1, TX2, TXn are included between the first switch and the second switch, and each branch includes a filter or a duplexer, and the input end and the output end of the filter or the duplexer are provided with an Input Matching Network (IMN) (IMN1, IMN2, IMNn) and an Output Matching Network (OMN) (OMN1, OMN2, OMNn), respectively, and RFIN in the figure represents a Radio Frequency Input.

With this implementation, a large number of devices can be integrated and a large area of board layout can be reduced, however, this implementation reduces the freedom of debugging, which brings great inconvenience to the radio frequency engineers during the debugging, and the PAMiD cannot achieve superior performance through debugging.

For example, after the channel TX1 is debugged, a group of common end impedance Z_ant1 with superior performance for the channel TX1 is obtained through the debugging, and the superior common end impedance Z_ant refers to the impedance at the input end of the antenna matching network;

When the channel TX2 is debugged, the channel TX2 is found to have a relatively poor operating performance, and at this time, because the matching network of the PAMiD has been fixed, the channel TX2 can operate in a better performance state by adjusting the antenna matching network only, and at this time, the common end impedance at the input end of the antenna matching network is Z_ant2, however, after the antenna matching network is adjusted, and when the PAMiD operates in the channel TX1, the common end impedance is still Z_ant2, and Z_ant2 is not the common end impedance that allows the channel TX1 to operate with superior performance, as a result, there is a possibility that the performance of the debugged channel TX1 will deteriorate.

By analogy, it would be a great workload to debug all the channels well, and there is no guarantee that each branch of the PAMiD will operate with superior performance.

Figure 2A:
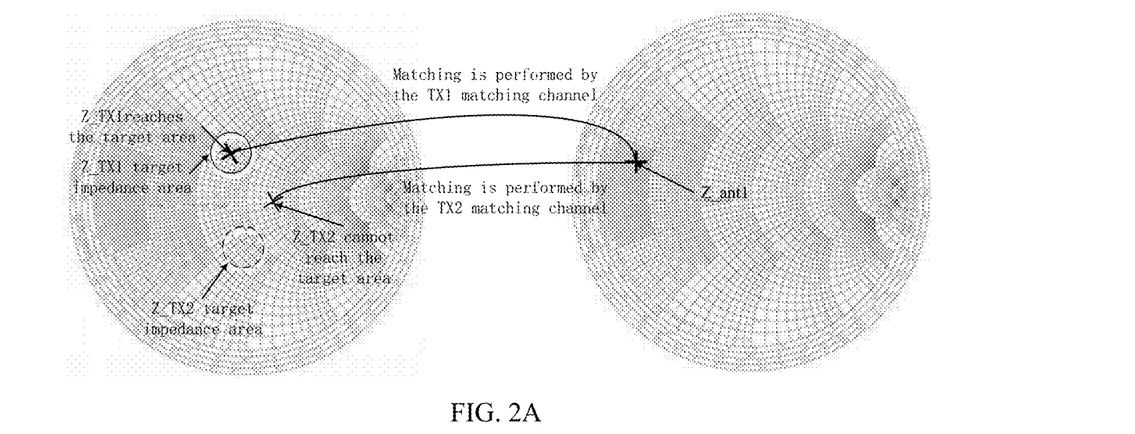
FIG. 2A is a first Smith chart of the impedance matching of a common end provided by some embodiments of the disclosure.
Figure 2B:
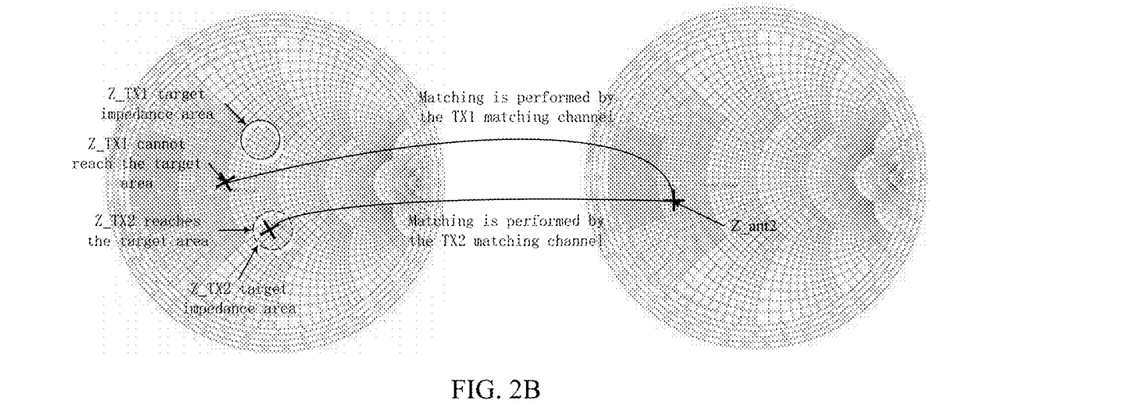
FIG. 2B is a second Smith chart of the impedance matching of a common end provided by some embodiments of the disclosure.

The Smith chart of the impedance matching process in this implementation is illustrated in FIGS. 2A and 2B. In FIG. 2A, after the impedance matching is performed on the channel TX1, the common end impedance of the radio frequency architecture is Z_ant1, and at this time, the impedance Z_TX1 of the channel TX1 can reach the target area, but the impedance Z_TX2 of the channel TX2 cannot reach the target area.

In FIG. 2B, after the impedance matching is performed on the channel TX2, the common end impedance of the radio frequency architecture is Z_ant2, and at this time, the impedance Z_TX2 of the channel TX2 can reach the target area, however, the impedance Z_TX1 of the channel TX1 cannot reach the target area at this time, which will lead to a possible deterioration of the performance of the channel TX1.

Figure 3:
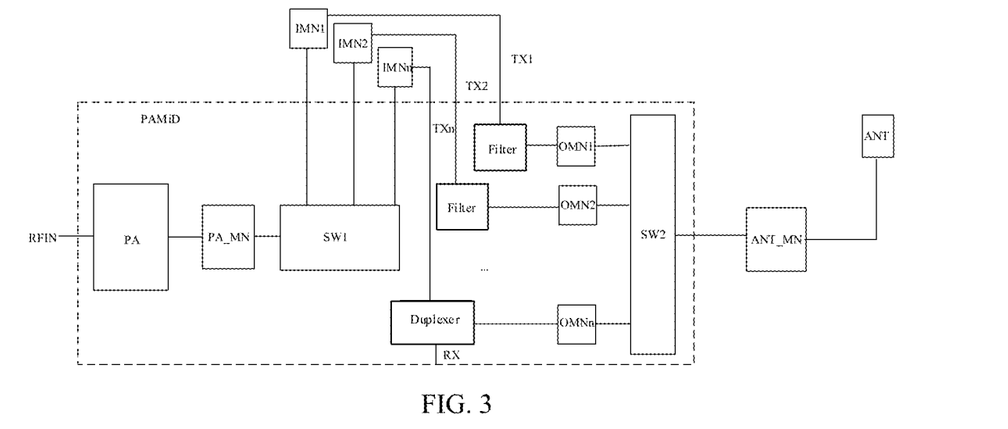
FIG. 3 is a second schematic diagram of an architecture of radio frequency front-end provided by some embodiments of the disclosure.

In view of the problems in the previous implementation, in another implementation of an architecture of radio frequency front-end as illustrated in FIG. 3, based on the implementation of FIG. 1, each channel between the SW1 and the filter or the duplexer is turned off, and the input matching network IMN1, IMN2, . . . IMNn originally provided between the SW1 and the filter or the duplexer are replaced with an off-chip matching network MN1, MN2, . . . MNn, and the architecture of radio frequency front-end of this implementation allows the impedance matching of each channel of the circuit of radio frequency front-end to be debugged individually without affecting the other channels, overcoming the inflexibility brought about by the solution of the first implementation. However, with this implementation, a large number of matching networks are still retained and does not significantly reduce the area of board layout of the architecture of radio frequency front-end, while increasing the cost. With the increase of the number of chip channels, the off-chip wiring will become more complicated, so this implementation is not a superior solution.

Based on the analysis of the above two implementations, various embodiments of the disclosure are provided.

In some embodiments of the disclosure, each branch in the PA and the PAMiD operates in a superior state by providing one or more tunable matching networks between the PA and the antenna, which are configured to adjust the impedance of the output end of the PA and/or the impedance of the input end of the antenna, so that the architecture of radio frequency front-end can maintain a better operating performance in the multiple radio frequency channels. By adjusting the impedance of the tunable matching network to achieve the impedance matching of the radio frequency architecture, the architecture of radio frequency front-end has the following advantages.

Debugging flexibility: the tunable matching network can be individually debugged and matched according to various different channels, without affecting other channels during the debugging, thus reducing the workload during the debugging.

High performance: the impedance matching and debugging of each channel are performed individually during the debugging, and by debugging each channel individually, each channel can be debugged to superior performance without affecting the performance of other channels.

Low cost: a large number of matching networks are not required, and the inherent cost of adopting the tunable matching networks is low.

Small occupied area: the high degree of integration can reduce the area of board layout.

The embodiments of the disclosure provide an architecture of radio frequency front-end, the architecture of radio frequency front-end includes a PAMiD, an antenna and at least one tunable matching network.

The PAMiD includes a power amplifier, and the at least one tunable matching network is located between the power amplifier and the antenna, and is configured to adjust the impedance of the output end of the power amplifier and/or the impedance of the input end of the antenna.

In some embodiments of the disclosure, the tunable matching network includes at least one type of the following components: an inductor, a capacitor, a resistor, a transmission line or a switch; herein, the impedance value in the tunable matching network is adjustable.

Figure 4:
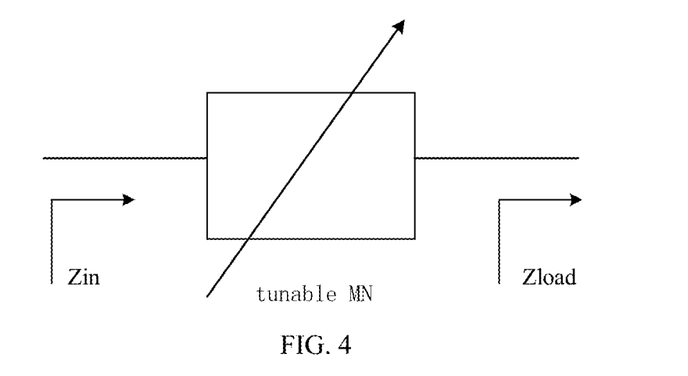
FIG. 4 is a schematic diagram of a tunable matching network provided by some embodiments of the disclosure.

In some embodiments, FIG. 4 is a schematic diagram of a tunable matching network of some embodiments of the disclosure, herein, Zin represents the impedance common to the tunable matching network and the load on the right side of the tunable matching network, and Zload represents the impedance of the load on the right side of the tunable matching network, i.e., Zload is the actual impedance of the load prior to the matching of the load, and Zin is the impedance of the load after the impedance matching of the load, herein the tunable matching network will be appropriately designed in order that the tunable matching network can be set up for different Zloads, so that the Zin can be adjusted to the desired impedance point without the addition of additional matching network components.

Figure 5A:
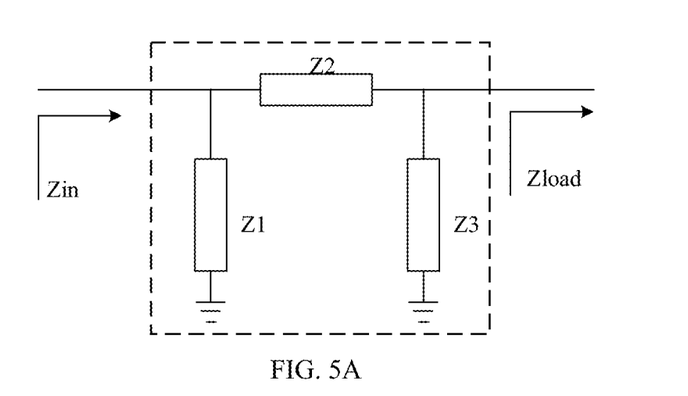
FIG. 5A is a first schematic diagrams of the topological structure of a tunable matching network provided by some embodiments of the disclosure.
Figure 5B:
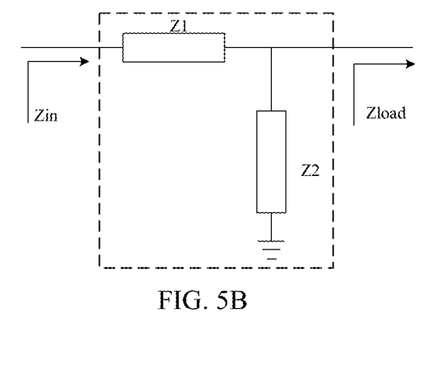
FIG. 5B is a second schematic diagrams of the topological structure of a tunable matching network provided by some embodiments of the disclosure.
Figure 5C:
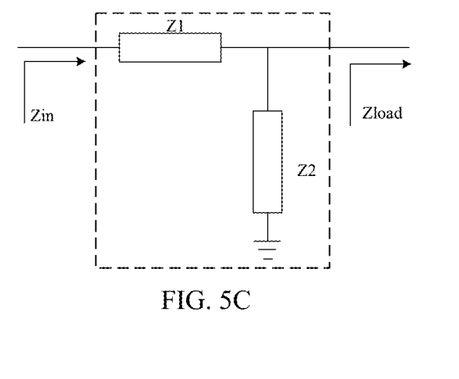
FIG. 5C is a third schematic diagrams of the topological structure of a tunable matching network provided by some embodiments of the disclosure.

For the tunable matching network in FIG. 4, three forms of topological structures illustrated in the FIGS. 5A, 5B, and 5C can be adopted, and it should be noted that the implementation of the tunable matching network includes, but is not limited to the three forms in FIGS. 5A, 5B, and 5C, and other implementations of topological structures can also be adopted, as long as the function of the impedance matching can be realized. FIG. 5A illustrates a Π-type matching network, FIG. 5B is an L-type matching network, and FIG. 5C is a T-type matching network, and Z1, Z2 and Z3 in FIGS. 5A, 5B, and 5C can be inductors, capacitors, resistors, transmission lines or switches, and furthermore, Z1, Z2 and Z3 can be reactance with fixed values or variable values, but at least one of Z1, Z2 or Z3 in the matching network is a variable reactance. Alternative implementation of variable reactance includes, but not limited to, the following forms: an electrically modulated varactor, an array of variable capacitors, a switching inductor or an array of resistors.

Figure 6:
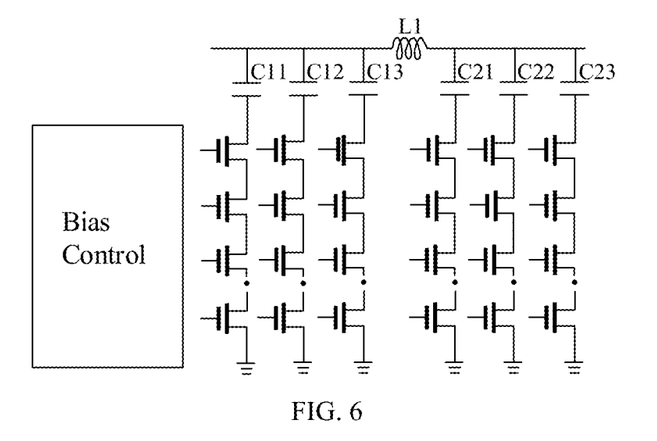
FIG. 6 is a schematic diagram of an array of variable capacitors provided by some embodiments of the disclosure.

An implementation of variable reactance that can be adopted in the embodiments of the disclosure may be an array of variable capacitors of FIG. 6. In FIG. 6, a Bias Control circuit, an inductor L1, capacitors (C11, C12, C13, C21, C22, C23) and several switches are included. With the array of variable capacitors of FIG. 6, the capacitance value of the capacitors connected to the matching network can be changed by switching on and off the switching elements, thereby changing the impedance of the matching network, and achieving the purpose of adjusting the impedance value of the matching network.

In some embodiments of the disclosure, the PAMiD further includes a first switch, a second switch and multiple branches located between the first switch and the second switch.

Each of the multiple branches comprises a filter or a duplexer, and the input end and the output end of the filter or the duplexer are provided with an input matching network and an output matching network, respectively.

It should be noted that in the embodiments of the disclosure, the adjustment of the impedance value of the tunable matching network can be achieved in several ways, and the adjustment of the impedance value of the tunable matching network is achieved by software control in the embodiments, and the impedance value of the entire tunable matching network is adjusted by controlling the reactance value of the variable reactance in the tunable matching network by software, and when the PAMiD operates in various different channels, the impedance value of the tunable matching network can be set separately by software, so as to achieve the purpose of the impedance matching and debugging of each branch of the PAMiD separately.

In some embodiments of the disclosure, the at least one tunable matching network includes at least one of: at least one first tunable matching network, at least one second tunable matching network, or at least one third tunable matching network.

In an alternative implementation of the disclosure, the first tunable matching network is located between the power amplifier and the first switch.

In an alternative implementation of the disclosure, a power amplifier matching network (PA_MN) is further provided between the power amplifier and the first switch, and the PA_MN is integrated into the PAMiD.

The first tunable matching network is located between the power amplifier matching network and the first switch.

In an alternative implementation of the disclosure, the first tunable matching network is integrated into the PAMiD; or, the first tunable matching network is independently provided outside of the PAMiD.

It should be noted that in embodiments of the disclosure, the first switch corresponds to SW1 in the drawings, the second switch corresponds to SW2 in the drawings, multiple branches corresponds to TX1, TX2, . . . TXn in the drawings, the input matching network corresponds to IMN1, IMN2, . . . IMNn in the drawings, the output matching network corresponds to OMN1, OMN2, . . . OMNn in the drawings, the filter corresponds to Filter in the drawings, the duplexer corresponds to Duplexer in the drawings, the antenna corresponds to ANT in the drawings, and the antenna matching network corresponds to ANT_MN in the drawings. In the drawings of the embodiments of the disclosure, RFIN represents the radio frequency input end, and MN represents the matching network.

Figure 7:
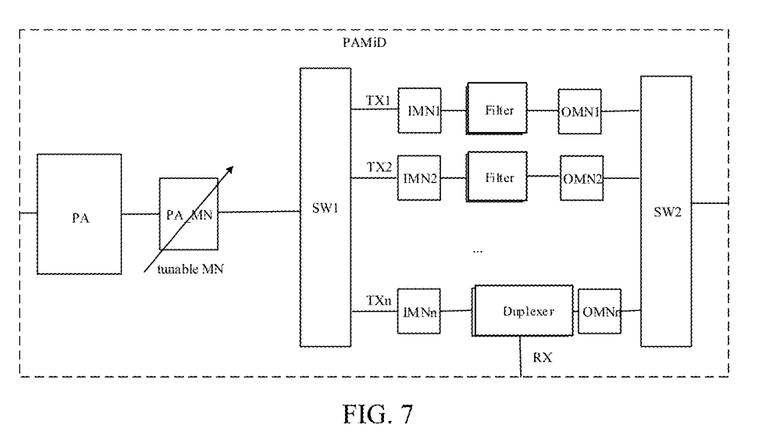
FIG. 7 is a schematic diagram of a first tunable matching network integrated into the PAMiD, provided by some embodiments of the disclosure.

In some embodiments, FIG. 7 is a schematic diagram of a first tunable matching network integrated into the PAMiD. Herein, the originally non-tunable PA_MN provided in the original PAMiD is set to be the first tunable matching network of the embodiment of the disclosure, and the first tunable matching network is integrated into the PAMiD and is located between the power amplifier and the first switch.

Figure 8:
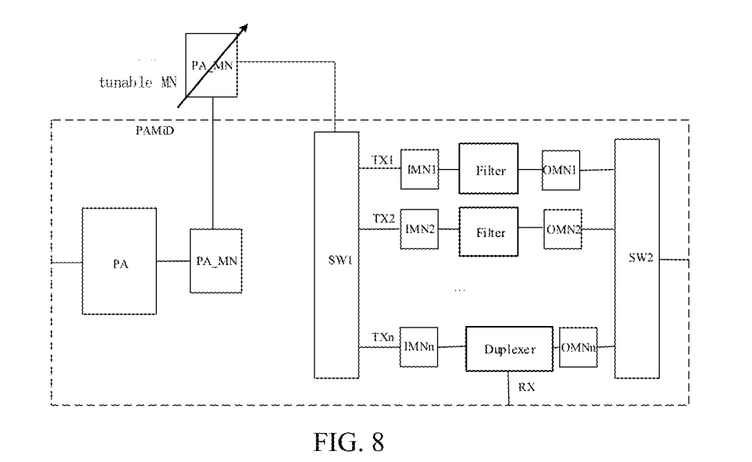
FIG. 8 is a schematic diagram of a first tunable matching network independently provided outside of the PAMiD, provided by some embodiments of the disclosure.

FIG. 8 is a schematic diagram of a first tunable matching network independently provided outside of the PAMiD; herein, the first tunable matching network is located between the PA_MN and the first switch. In another alternative implementation, a first tunable matching network can also be provided between the power amplifier and the PA_MN.

The implementation of FIG. 7 has a higher degree of integration than that of the implementation of FIG. 8. Both implementations of FIG. 7 and FIG. 8 are capable of achieving debugging each channel of the PAMiD individually and achieving the impedance matching of the radio frequency architecture through setting the first tunable matching network by setting the software, so that the architecture of radio frequency front-end operates in different channels, and that the power amplifier may operate in a better state, so that the radio frequency architecture achieves a superior operating performance, with characteristics such as debugging flexibility, high performance, low cost, small occupied area, etc.

In an alternative implementation of the disclosure, the second tunable matching network is located between the second switch and the antenna.

In an alternative implementation of the disclosure, an antenna matching network is further provided between the second switch and the antenna.

The second tunable matching network is located between the antenna matching network and the antenna; or, The second tunable matching network is located between the second switch and the antenna matching network.

In an alternative implementation of the disclosure, in a case that the second tunable matching network is located between the second switch and the antenna matching network, the second tunable matching network is integrated into the PAMiD; or, The second tunable matching network is independently provided between the PAMiD and the antenna matching network.

Figure 9:
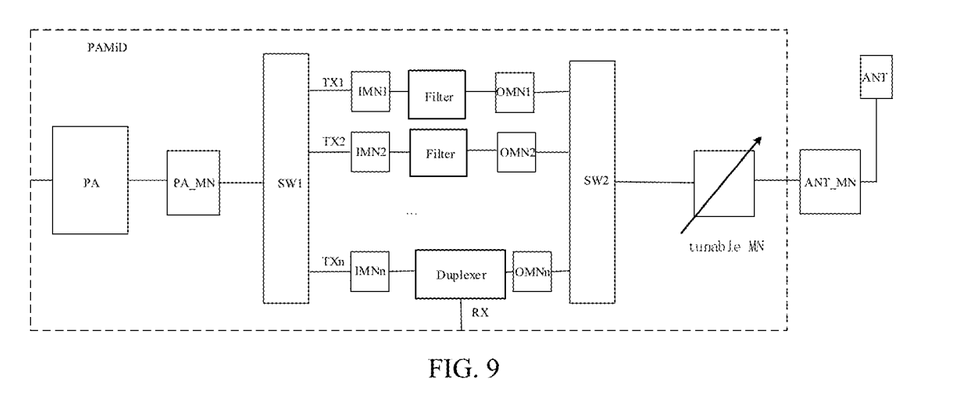
FIG. 9. is a schematic diagram of a second tunable matching network located between a second switch and an antenna matching network and integrated into the PAMiD, provided by some embodiments of the disclosure.
Figure 10:
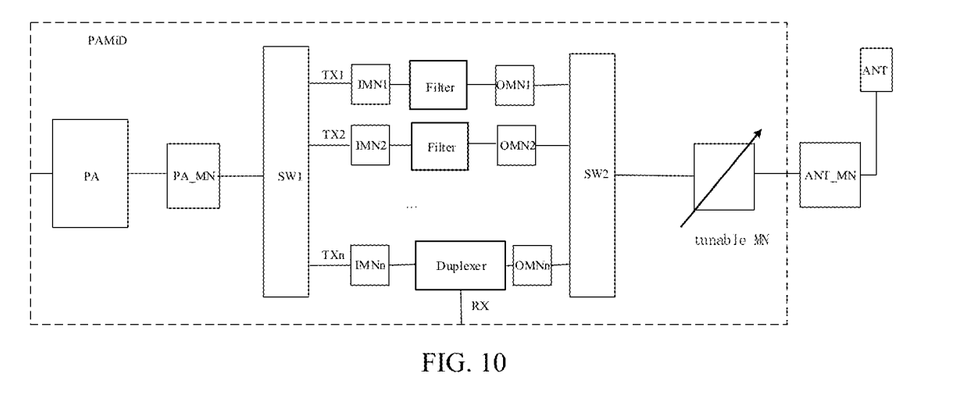
FIG. 10 is a schematic diagram of a second tunable matching network provided between an antenna matching network and an antenna, provided by some embodiments of the disclosure.

In some embodiments, FIG. 9. is a schematic diagram of a second tunable matching network located between a second switch and an antenna matching network and integrated into the PAMiD; FIG. 10 is a schematic diagram of a second tunable matching network located between an antenna matching network and an antenna. Herein, the implementation of FIG. 9 has a higher degree of integration than that of the implementation of FIG. 10.

Both implementations of FIG. 9 and FIG. 10 are capable of achieving debugging each channel of the PAMiD individually and achieving the impedance matching of the radio frequency architecture through setting the first tunable matching network by setting the software, so that the architecture of radio frequency front-end operates in different channels, and that the power amplifier may operate in a better state, so that the radio frequency architecture achieves a superior operating performance, with characteristics such as debugging flexibility, high performance, low cost, small occupied area, etc.

In an alternative implementation of the disclosure, the third tunable matching network is located in the branch of the PAMiD.

In an alternative implementation of the disclosure, the third tunable matching network is an input matching network in the branch; or, The third tunable matching network is an output matching network in the branch.

Figure 11:
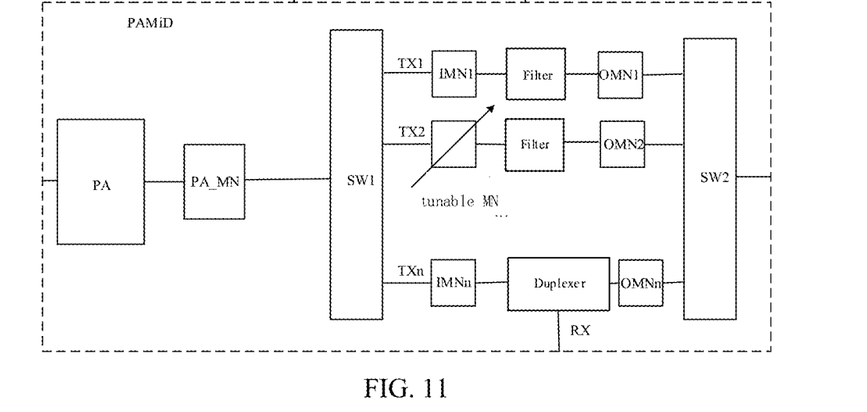
FIG. 11 is a schematic diagram of a third tunable matching network located in the branch of the PAMiD.

FIG. 11 is a schematic diagram of a third tunable matching network located in the branch of the PAMiD, and one or more third tunable matching networks may be provided in multiple branches of the PAMiD in FIG. 11, herein, the third tunable matching network may be located at the front of the filter in each branch or may be located at the rear of the filter, and may replace the input matching network and/or the output matching network originally located at the front of the filter. By adjusting the third tunable matching network of each branch of the PAMiD, the performance of the branch in which the third tunable matching network is located may be adjusted individually, so that the channel in which the branch is located has superior performance during operation, herein, the adjustment of the impedance value of the third tunable matching network may still be achieved by software control.

In the embodiments of the disclosure, the first tunable matching network, the second tunable matching network and the third tunable matching network may be used in combination, and multiple tunable matching networks may be included in the architecture of radio frequency front-end. FIGS. 12-17 illustrate several alternative implementations of the disclosure. Herein, the integration of a tunable matching network into the PAMiD can improve the degree of integration of the architecture of radio frequency front-end.

Figure 12:
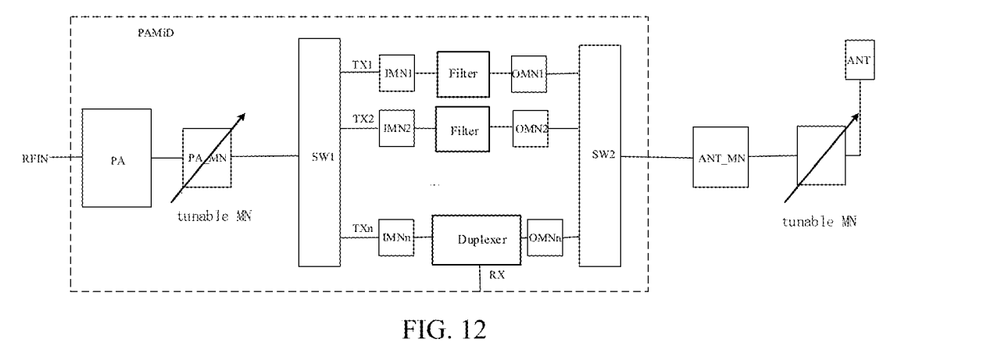
FIG. 12 is the third schematic diagram of an architecture of radio frequency front-end provided by the embodiment of the disclosure.

In an alternative implementation of the disclosure, the architecture of radio frequency front-end adopts the solution of the architecture as illustrated in FIG. 12. Herein, the first tunable matching network is a power amplifier matching network, which is located between the power amplifier and the first switch and is integrated into the PAMiD, and the antenna matching network is provided between the second switch and the antenna, and the second tunable matching network is provided between the antenna matching network and the antenna, and when each channel of the PAMiD is debugged, each channel of the PAMiD can be debugged in turn by setting the impedance values of the first tunable matching network and the second tunable matching network, and when the PAMiD operates in different branches, the impedance values of the first tunable matching network and the second tunable matching network can be adjusted by software control, so that the architecture of radio frequency front-end can achieve superior operating performance in multiple radio frequency channels.

Figure 13:
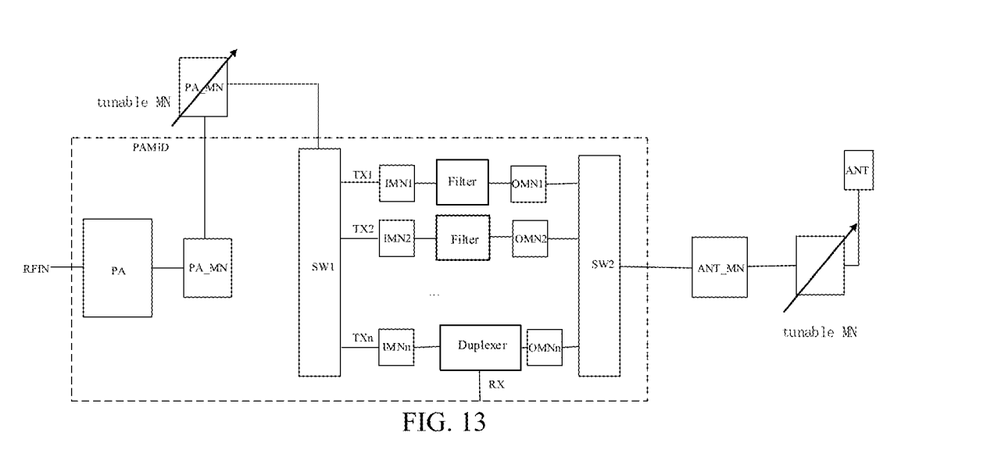
FIG. 13 is a fourth schematic diagram of an architecture of radio frequency front-end provided by some embodiments of the disclosure.

In an alternative implementation of the disclosure, the architecture of radio frequency front-end adopts the solution of the architecture as illustrated in FIG. 13. Herein, the first tunable matching network is a power amplifier matching network, which is located between the power amplifier and the first switch and is independently provided outside of the PAMiD, and the antenna matching network is provided between the second switch and the antenna, and the second tunable matching network is provided between the antenna matching network and the antenna, and when each channel of the PAMiD is debugged, each channel of the PAMiD can be debugged in turn by setting the impedance values of the first tunable matching network and the second tunable matching network, and when the PAMiD operates in different branches, the impedance values of the first tunable matching network and the second tunable matching network can be adjusted by software control, so that the architecture of radio frequency front-end can achieve superior operating performance in multiple radio frequency channels.

Figure 14:
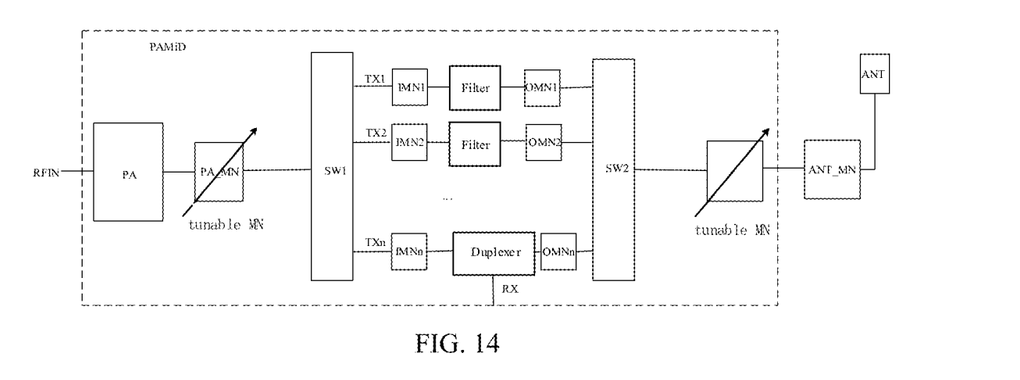
FIG. 14 is a fifth schematic diagram of an architecture of radio frequency front-end provided by some embodiments of the disclosure.

In an alternative implementation of the disclosure, the architecture of radio frequency front-end adopts the solution of the architecture as illustrated in FIG. 14. Herein, the first tunable matching network is a power amplifier matching network, which is located between the power amplifier and the first switch and is integrated into the PAMiD, and the antenna matching network is provided between the second switch and the antenna, and the second tunable matching network is provided between the second switch and the antenna matching network and is integrated into the PAMiD, and when each channel of the PAMiD is debugged, each channel of the PAMiD can be debugged in turn by setting the impedance values of the first tunable matching network and the second tunable matching network, and when the PAMiD operates in different branches, the impedance values of the first tunable matching network and the second tunable matching network can be adjusted by software control, so that the architecture of radio frequency front-end can achieve superior operating performance in multiple radio frequency channels.

Figure 15:
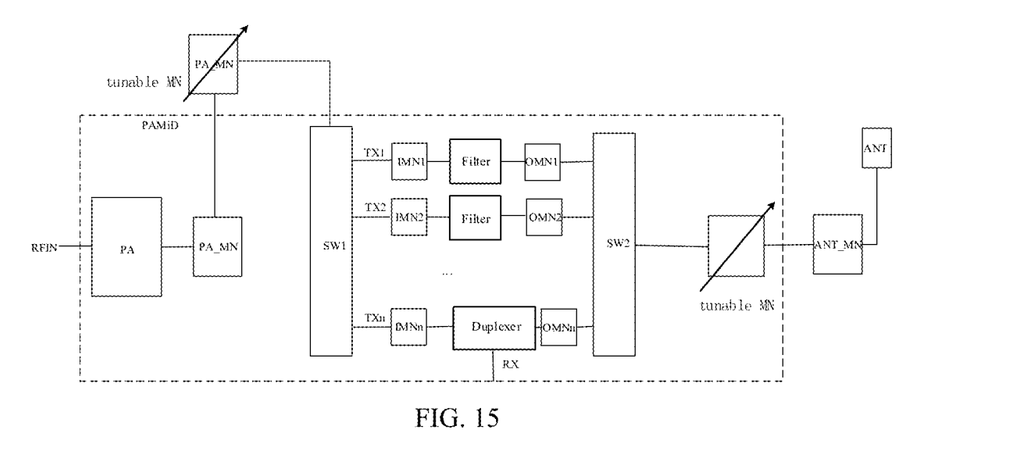
FIG. 15 is a sixth schematic diagram of an architecture of radio frequency front-end provided by some embodiments of the disclosure.

In an alternative implementation of the disclosure, the architecture of radio frequency front-end adopts the solution of the architecture as illustrated in FIG. 15. Herein, the first tunable matching network is a power amplifier matching network, which is located between the power amplifier and the first switch and is independently provided outside of the PAMiD, and the antenna matching network is provided between the second switch and the antenna, and the second tunable matching network is provided between the second switch and the antenna matching network and is integrated into the PAMiD, and when each channel of the PAMiD is debugged, each channel of the PAMiD can be debugged in turn by setting the impedance values of the first tunable matching network and the second tunable matching network, and when the PAMiD operates in different branches, the impedance values of the first tunable matching network and the second tunable matching network can be adjusted by software control, so that the architecture of radio frequency front-end can achieve superior operating performance in multiple radio frequency channels.

Figure 16:
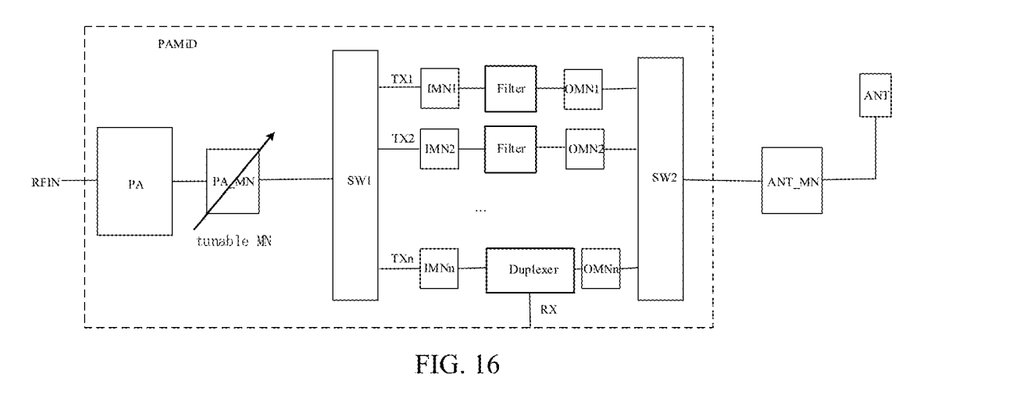
FIG. 16 is a seventh schematic diagram of an architecture of radio frequency front-end provided by some embodiments of the disclosure.

In an alternative implementation of the disclosure, the architecture of radio frequency front-end adopts the solution of the architecture as illustrated in FIG. 16. Herein, the first tunable matching network is a power amplifier matching network, which is located between the power amplifier and the first switch and is integrated into the PAMiD, and when each channel of the PAMiD is debugged, each channel of the PAMiD can be debugged in turn by setting the impedance value of the first tunable matching network, and when the PAMiD operates in different branches, the impedance value of the first tunable matching network can be adjusted by software control, so that the architecture of radio frequency front-end can achieve superior operating performance in multiple radio frequency channels.

Figure 17:
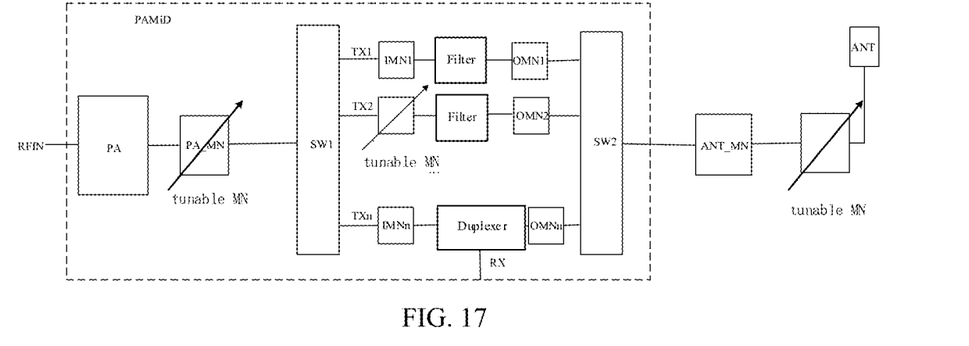
FIG. 17 is an eighth schematic diagram of an architecture of radio frequency front-end provided by some embodiments of the disclosure.

In an alternative implementation of the disclosure, the architecture of radio frequency front-end adopts the solution of the architecture as illustrated in FIG. 17. Herein, the first tunable matching network is a power amplifier matching network, which is located between the power amplifier and the first switch and is integrated into the PAMiD, and the antenna matching network is provided between the second switch and the antenna, and the second tunable matching network is provided between the antenna matching network and the antenna, and the third tunable matching network is provided at the input end of the filter of the branch TX2 of the PAMiD. When each channel of the PAMiD is debugged, each channel of the PAMiD can be debugged in turn by setting the impedance values of the first tunable matching network and the second tunable matching network, and the branch TX2 is adjusted by setting the impedance value of the third tunable matching network, and when the PAMiD operates in different branches, the impedance values of the tunable matching networks in the architecture of radio frequency front-end can be adjusted by software control, so that the architecture of radio frequency front-end can achieve superior operating performance in multiple radio frequency channels.

It should be noted that the technical solutions of the disclosure have multiple implementations, and are not limited to the solutions of several architectures listed in FIGS. 12-17, and the addition or subtraction of one or more tunable matching networks in the above implementations, or the combination of the above implementations, all belong to the scope of protection of the disclosure as long as they can achieve the purpose of the disclosure.

In several embodiments provided in the disclosure, it should be appreciated that the disclosed method and the smart device may be implemented in other ways. The above-described embodiments of device are merely illustrative, for example, the division of the units is only a division based on logical functions, and there may be other divisions in actual implementations, e.g., multiple units or components may be combined, or may be integrated into another system, or some features may be ignored, or may not be performed. In addition, the coupling, direct coupling or communication connection between the components illustrated or discussed may be indirect coupling or communication connection through some interfaces, devices or units, which may be electrical, mechanical or otherwise.

The above-mentioned units illustrated as separate components may be or may not be physically separated, and the components illustrated as units may be or may not be physical units, i.e., they may be located in one place or distributed to multiple network units; some or all of the units may be selected according to actual needs to achieve the purpose of the solutions of the embodiments.

In addition, all the functional units in the embodiments of the disclosure may be integrated into a second processing unit, and each unit may also be used separately as a single unit, and two or more units may also be integrated into a single unit; the above integrated units may be realized either in the form of hardware or in the form of hardware together with software functional units.

The terms "first" and "second" are used for descriptive purposes only and are not to be construed as indicating or implying a relative importance or implicitly indicating the number of technical features indicated. Thus, elements referred to as "first" and "second" may include one or more of the features either explicitly or implicitly. In the description of the present disclosure, "a plurality" indicates two or more unless specifically defined otherwise.

In the present disclosure, the terms "installed," "connected," "coupled," "fixed" and the like shall be understood broadly, and may be either a fixed connection or a detachable connection, or integrated, unless otherwise explicitly defined. These terms can refer to mechanical or electrical connections, or both. Such connections can be direct connections or indirect connections through an intermediate medium. These terms can also refer to the internal connections or the interactions between elements. The specific meanings of the above terms in the present disclosure can be understood by those of ordinary skill in the art on a case-by-case basis.

In the description of the present disclosure, the terms "one embodiment," "some embodiments," "example," "specific example," or "some examples," and the like may indicate a specific feature described in connection with the embodiment or example, a structure, a material or feature included in at least one embodiment or example. In the present disclosure, the schematic representation of the above terms is not necessarily directed to the same embodiment or example.

Moreover, the particular features, structures, materials, or characteristics described may be combined in a suitable manner in any one or more embodiments or examples. In addition, various embodiments or examples described in the specification, as well as features of various embodiments or examples, may be combined and reorganized.

While this specification contains many specific implementation details, these should not be construed as limitations on the scope of any claims, but rather as descriptions of features specific to particular implementations. Certain features that are described in this specification in the context of separate implementations can also be implemented in combination in a single implementation. Conversely, various features that are described in the context of a single implementation can also be implemented in multiple implementations separately or in any suitable subcombination.

Moreover, although features may be described above as acting in certain combinations and even initially claimed as such, one or more features from a claimed combination can in some cases be excised from the combination, and the claimed combination may be directed to a subcombination or variation of a subcombination.

Thus, particular implementations of the subject matter have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking or parallel processing may be utilized.

It is intended that the specification and embodiments be considered as examples only. Other embodiments of the disclosure will be apparent to those skilled in the art in view of the specification and drawings of the present disclosure. That is, although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to, the disclosed aspects of the example embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

What is claimed is:

1. An architecture of radio frequency front-end, comprising:
    a power amplifier module integrated duplexer (PAMiD);
    an antenna; and
    at least one tunable matching network;
    wherein the PAMiD comprises a power amplifier, and the at least one tunable matching network is located between the power amplifier and the antenna, and is configured to adjust the impedance of the output end of the power amplifier and/or the impedance of the input end of the antenna;
    wherein the PAMiD further comprises a first switch, a second switch and a plurality of branches located between the first switch and the second switch; and
    wherein each of the plurality of branches comprises a filter or a duplexer, and the input end and the output end of the filter or the duplexer are provided with an input matching network and an output matching network, respectively.

2. The architecture of radio frequency front-end of claim 1, wherein the at least one tunable matching network comprises at least one of: at least one first tunable matching network, at least one second tunable matching network, or at least one third tunable matching network.

3. The architecture of radio frequency front-end of claim 2, wherein the first tunable matching network is located between the power amplifier matching network and the first switch.

4. The architecture of radio frequency front-end of claim 3,
    wherein a power amplifier matching network is further provided between the power amplifier and the first switch, and the power amplifier matching network is integrated into the PAMiD; and
    wherein the first tunable matching network is located between the power amplifier matching network and the first switch.

5. The architecture of radio frequency front-end of claim 4, wherein
    the first tunable matching network is integrated into the PAMiD; or,
    the first tunable matching network is independently provided outside of the PAMiD.

6. The architecture of radio frequency front-end of claim 2, wherein the second tunable matching network is located between the second switch and the antenna.

7. The architecture of radio frequency front-end of claim 6,
wherein an antenna matching network is further provided between the second switch and the antenna, and
wherein the second tunable matching network is located between the antenna matching network and the antenna; or,
the second tunable matching network is located between the second switch and the antenna matching network.

8. The architecture of radio frequency front-end of claim 7,
wherein in a case that the second tunable matching network is located between the second switch and the antenna matching network,
the second tunable matching network is integrated into the PAMiD; or,
the second tunable matching network is independently provided between the PAMiD and the antenna matching network.

9. The architecture of radio frequency front-end of claim 2, wherein the third tunable matching network is located in the branch of the PAMiD.

10. The architecture of radio frequency front-end of claim 9, wherein
the third tunable matching network is an input matching network in the branch; or,
the third tunable matching network is an output matching network in the branch.

11. The architecture of radio frequency front-end of claim 10, wherein the tunable matching network comprises at least one of: an inductor, a capacitor, a resistor, a transmission line and a switch; and wherein the impedance value of the tunable matching network is adjustable.

12. A communication apparatus comprising the architecture of radio frequency front-end of claim 1, wherein the tunable matching network comprises at least one of: an inductor, a capacitor, a resistor, a transmission line, and a switch.

13. The communication apparatus of claim 12, wherein an impedance matching of the architecture of radio frequency front-end is realized through the tunable matching network, to thereby improve operating performance of the communication apparatus in multiple radio frequency channels.

14. The communication apparatus of claim 13,
wherein the at least one tunable matching network comprises at least one of: at least one first tunable matching network, at least one second tunable matching network, or at least one third tunable matching network; and
wherein the first tunable matching network is located between the power amplifier matching network and the first switch.

15. The communication apparatus of claim 14,
wherein a power amplifier matching network is further provided between the power amplifier and the first switch, and the power amplifier matching network is integrated into the PAMiD; and
wherein the first tunable matching network is located between the power amplifier matching network and the first switch.

16. The communication apparatus of claim 15, wherein
the first tunable matching network is integrated into the PAMiD; or,
the first tunable matching network is independently provided outside of the PAMiD.

17. The communication apparatus of claim 14,
wherein the second tunable matching network is located between the second switch and the antenna;
wherein an antenna matching network is further provided between the second switch and the antenna,
wherein the second tunable matching network is located between the antenna matching network and the antenna; or,
the second tunable matching network is located between the second switch and the antenna matching network; and
wherein in a case that the second tunable matching network is located between the second switch and the antenna matching network,
the second tunable matching network is integrated into the PAMiD; or,
the second tunable matching network is independently provided between the PAMiD and the antenna matching network.

18. The communication apparatus of claim 14, wherein the third tunable matching network is located in the branch of the PAMiD.

19. The communication apparatus of claim 18, wherein
the third tunable matching network is an input matching network in the branch; or,
the third tunable matching network is an output matching network in the branch.

* * * * *